United States Patent [19]
Holland et al.

[11] Patent Number: 5,975,013
[45] Date of Patent: *Nov. 2, 1999

[54] VACUUM PLASMA PROCESSOR HAVING COIL WITH SMALL MAGNETIC FIELD IN ITS CENTER

[75] Inventors: John Patrick Holland, Santa Clara; Michael S. Barnes, San Francisco, both of Calif.

[73] Assignee: Lam Research Corporation, Fremont, Calif.

[*] Notice: This patent is subject to a terminal disclaimer.

[21] Appl. No.: 08/978,868

[22] Filed: Nov. 28, 1997

Related U.S. Application Data

[63] Continuation of application No. 08/661,203, Jun. 10, 1996, Pat. No. 5,800,619.

[51] Int. Cl.$^6$ .................................................. H05H 1/00
[52] U.S. Cl. ........................................ 118/723 I; 156/345
[58] Field of Search ........................... 118/723 I; 156/345

[56] References Cited

U.S. PATENT DOCUMENTS

| | | |
|---|---|---|
| 4,340,482 | 7/1982 | Sternberg . |
| 4,440,108 | 4/1984 | Little et al. . |
| 4,612,077 | 9/1986 | Tracy et al. . |
| 4,615,755 | 10/1986 | Tracy et al. . |
| 4,617,079 | 10/1986 | Tracy et al. . |
| 4,826,585 | 5/1989 | Davis . |
| 4,948,458 | 8/1990 | Ogle . |
| 5,198,718 | 3/1993 | Davis et al. . |
| 5,216,329 | 6/1993 | Pelleteir . |
| 5,226,967 | 7/1993 | Chen et al. . |
| 5,231,334 | 7/1993 | Paranjpe . |
| 5,234,529 | 8/1993 | Johnson . |
| 5,241,245 | 8/1993 | Barnes et al. . |
| 5,261,962 | 11/1993 | Hamamoto et al. . |
| 5,277,751 | 1/1994 | Ogle . |
| 5,280,154 | 1/1994 | Cuomo et al. . |
| 5,304,279 | 4/1994 | Coultas et al. . |
| 5,309,063 | 5/1994 | Singh . |
| 5,368,710 | 11/1994 | Chen et al. . |
| 5,401,350 | 3/1995 | Patrick et al. . |
| 5,405,480 | 4/1995 | Benzing et al. . |
| 5,433,812 | 7/1995 | Cuomo et al. . |
| 5,529,657 | 6/1996 | Ishii . |
| 5,540,824 | 7/1996 | Yin et al. . |
| 5,558,722 | 9/1996 | Okumura et al. . |

FOREIGN PATENT DOCUMENTS

| | | |
|---|---|---|
| 0517042 A1 | 12/1992 | European Pat. Off. . |
| 0596551 | 5/1994 | European Pat. Off. . |
| 0710055 | 5/1996 | European Pat. Off. . |
| 8-83695 | 3/1996 | Japan . |
| 8-148476 | 6/1996 | Japan . |

OTHER PUBLICATIONS

Fukusawa et al., "RF Self–Bias Characteristics in Inductively Coupled Plasma," Jpn. J. Appl. Phys. vol. 32 (1993) pp. 6076–6079, Part 1, No. 12B, Dec. 1993.

*Primary Examiner*—Thi Dang
*Attorney, Agent, or Firm*—Lowe Hauptman Gopstein Gilman & Berner

[57] ABSTRACT

A substantially planar coil of a vacuum plasma processor has plural turns for exciting gas in the processor to a plasma state in response to r.f. coil energization. The coil is located outside the processor and surrounded by a shield tending to cause magnetic flux coupled from peripheral portions of the coil to the gas to be less than magnetic flux coupled from interior portions of the coil to the gas. The coil is arranged so magnetic flux derived from a center portion of an area circumscribed by the coil is less than the magnetic flux derived from all other areas circumscribed by the coil. The magnetic flux is such that the density of the plasma in the processor on a processed substrate is relatively uniform even though the coil exhibits transmission line properties so there are substantial peak-to-peak current variations along the length of the coil.

25 Claims, 4 Drawing Sheets

VACUUM PLASMA PROCESSOR HAVING COIL WITH SMALL MAGNETIC FIELD IN ITS CENTER

This application is a continuation of application Ser. No. 08/661,203 filed Jun. 10, 1996, now U.S. Pat. No. 5,800,619.

FIELD OF INVENTION

The present invention relates generally to vacuum plasma processors and more particularly to such a processor including a plural turn substantially planar coil arranged so magnetic flux derived from a center portion of an area circumscribed by the coil is less than the magnetic flux derived from all other areas circumscribed by the coil.

BACKGROUND ART

Various structures have been developed to supply r.f. fields from devices outside of a vacuum chamber to excite a gas in a plasma processor to a plasma state. The r.f. fields have been derived from electric field sources including capacitive electrodes, electromagnetic field sources including electron cyclotron resonators, and induction, i.e., magnetic, field sources including coils. The excited plasma interacts with a workpiece in the chamber to etch the workpiece or to deposit material on it. The workpiece can be a semiconductor wafer having a planar circular surface or a solid dielectric, e.g., a rectangular glass substrate used in flat panel displays or a metal plate.

A processor for treating workpieces with an inductively coupled planar plasma (ICPP) source is disclosed, inter alia, by Ogle, U.S. Pat. No. 4,948,458, commonly assigned with the present invention. In Ogle, the magnetic field that excites the plasma is derived from a planar coil positioned on or adjacent to a single planar dielectric window that extends in a direction generally parallel to the workpiece planar surface being processed. The coil is connected to be responsive to an r.f. source having a frequency in the range of 1 to 100 MHz (typically 13.56 MHz) and coupled to the coil by an impedance matching network. The coil is configured as a planar linear spiral having external and internal terminals connected to be responsive to the r.f. source. Coultas et al., U.S. Pat. No. 5,304,279 discloses a similar device employing plasma confinement using permanent magnets in combination with the planar spiral coil.

Cuomo et al., U.S. Pat. No. 5,277,751 and Ogle, U.S. Pat. No. 5,277,751 disclose variations of the aforementioned processors wherein the planar spiral coil is replaced by a solenoidal coil. The solenoidal coil is wound on a dielectric mandrel or the like and includes plural helical-like turns, a portion of which extend along the dielectric window surface. The remainder of the coil extends above the dielectric window. Opposite ends of the solenoidal coil are connected to an r.f. excitation source.

These inductive sources excite the plasma by heating electrons in the plasma region near the vacuum side of the dielectric window by oscillating inductive fields produced by the coil and coupled through the dielectric window. Inductive currents which heat the plasma electrons are derived from the r.f. magnetic fields produced by r.f. currents in the planar coil. The spatial distribution of the magnetic field is a function of the sum of the fields produced by each of the turns of the coil. The field produced by each of the turns is a function of the magnitude of r.f. current in each turn. For the spiral design disclosed by the Ogle '458 patent, the r.f. currents in the spiral coil are distributed to produce a ring shaped region where power is absorbed by the plasma.

The ring shaped region abuts the vacuum side of the dielectric window. At the low pressures, in the 1.0 to 10 mTorr range, diffusion of the plasma from the ring shaped region produces a plasma flux peak in a central portion of the chamber, along a chamber center line away from the window. At intermediate pressure ranges, in the 10 to 100 mTorr range, gas phase collisions of electrons, ions, and neutrons in the plasma prevent substantial diffusion of the plasma charged particles outside of the annular region. As a result there is a relatively high plasma flux in a ring like region of the workpiece but low plasma fluxes in the center and peripheral workpiece portions. Hence, there are substantially large plasma flux variations between the ring and the volumes inside and outside of the ring.

Chen et al., U.S. Pat. No. 5,226,967 considers the adverse effects of reduced plasma flux at radial regions removed from the center of a planar spiral coil. In Chen '967, the field strength of magnetic fields generated by the planar coil and coupled to the plasma decreases along the chamber center line. The decrease is provided by increasing the thickness of the dielectric window center portion, relative to the thickness of other regions of the window. At pressures up to about 20 mTorr, the increased thickness of the solid dielectric material extending into the plasma shifts the ring shaped region for r.f. power absorption to a larger radius. The shift of the ring shaped region position changes the diffusion characteristics of this plasma generation region so diffusion is more uniform across the substrate diameter, particularly at the peripheral portion of the substrate.

In the device of the '967 patent, an electromagnetic shield that supports the dielectric window causes a decrease in plasma flux close to the center of the coil. This plasma flux density reduction occurs because the shield decreases coupling between the coil and an electromagnetic field resulting from the r.f. current applied to the coil. The magnetic fields produced by the largest diameter turn of the planar source frequently induce r.f. currents in the electromagnetic shield which supports the window, if the shield and largest turn are sufficiently close to each other. Power coupled to the shield results in (1) a decrease in the coupling efficiency of the r.f. excitation of the plasma and (2) a shift of the ring shaped power absorption region to a smaller diameter region since the magnetic field produced by the largest diameter turn of the coil does not couple as much as the inner turns. Substantial uniformity up to about 20 mTorr occurs as a result of diffusion of charged particles into the region below the center of the coil, where the window is thickest. However, as pressure increases above about 20 mTorr, where charged particular diffusion decreases appreciably, the plasma flux beneath the center of the coil, where the r.f. excitation is small, decreases relative to the flux in the other regions beneath the coil. Hence, there is non-uniform plasma flux on different portions of the workpiece.

The ring shaped region over which a planar coil couples r.f. power to the plasma can be shifted to larger diameters by removing the inner turns of the planar spiral. Fukusawa et al. in an article entitled "RF Self-Bias Characteristics in Inductively Coupled Plasma," Japanese Journal of Applied Physics, Vol. 32 (1993), pages 6076–6079, Part 1, No. 12(B), December 1993, discloses a single turn planar spiral coil for exciting gases in a plasma processor to a plasma condition. The disclosed coil has inner and outer dimensions of 120 and 160 mm and is 0.5 mm thick and is located in the vicinity of the periphery of a dielectric plate which serves as the top of the vacuum vessel. The ostensible purpose of the one turn coil is to produce a uniform plasma flux radial distribution. However, as illustrated in FIG. 6 of Fukusawa et al., the plasma flux is not particularly uniform even at a relatively low plasma processor pressure of 10 milliTorr, particularly for the types of r.f. excitation power which are required for plasma etching, in the 1 kilowatt range. For 1 kilowatt r.f. excitation of the single turn source, disclosed by Fukusawa et al., the plasma produces a substantial plasma flux peak (of $7.5 \times 10^{11}$ ions cm$^{-3}$), at a position approximately 4.0 centimeters from the center of the chamber. This peak occurs only on one side of the center axis, creating a significant non-radial asymmetry in the spatial distribution of the plasma. The one-turn spiral disclosed by Fukusawa et al. results in a shift in the coupling region to a larger diameter relative to the full spiral disclosed by Ogle in the '458 patent. The Fukusawa et al. devices also exhibit a nonradial asymmetry which equals or exceeds the radial nonuniformity in the spatial distribution of the plasma flux generated by a full spiral. The range of pressures over which the one turn coil can be operated is also limited since this coil relies on diffusion to shift plasma from the ring shaped plasma generation region near the periphery of the chamber to the center of the chamber. At pressures above 10 milliTorr, collisions of charge and uncharge particles in the plasma result in a severe decrease in plasma flux in the center region of the chamber.

It is, accordingly, an object of the present invention to provide a new and improved substantially planar coil for excitation of a gas in an r.f. vacuum plasma processor to a plasma state.

Another object of the invention is to provide a new and improved planar coil in an r.f. vacuum plasma processor, which coil is arranged to provide a relatively uniform plasma flux over the entire processed surface of a treated workpiece.

Another object of the invention is to provide a new and improved planar coil for a vacuum plasma processor that can operate at relatively high pressures, above 15 milliTorr, wherein the coil is arranged to provide a relatively uniform plasma flux on a workpiece.

Another object of the invention is to provide a new and improved planar coil in a plasma processor, which coil is arranged to provide a relatively uniform plasma on a treated workpiece, even though a shield is employed with the plasma processor to shield the coil from its surrounding environment.

Another object of the invention is to provide a new and improved planar coil for a plasma processor that operates at relatively high pressures, above 15 milliTorr, wherein the coil is arranged to provide a relatively uniform plasma flux on a workpiece.

THE INVENTION

In accordance with one aspect of the present invention, a vacuum plasma processor has a substantially coil with plural radially displaced turns for exciting gas in the processor to a plasma state in response to r.f. energization of the coil, wherein the coil is arranged so magnetic flux derived from a center portion of an area circumscribed by the coil is less than the magnetic flux derived from all other areas circumscribed by the coil. As in the prior art, the coil is located outside of the processor and surrounded by a shield which tends to cause magnetic flux coupled from peripheral portions of the coil to the gas to be less than magnetic flux coupled from interior portions of the coil to the gas.

In certain arrangements, the coil includes plural parallel segments driven in parallel by r.f. current from a source of the r.f. energization. Each of these segments has plural arcuate portions on diametrically opposite sides of a center point of the area. Each of the arcuate portions is removed from the area center point. The segments are arranged and connected to the source so currents flowing in spatially adjacent portions of different segments flow in the same direction. Preferably, a common terminal for connection of the segments to the source is in a center portion of the area.

In one parallel arrangement, the parallel segments are surrounded by a further segment connected in series to the parallel segments so all of the currents flowing in the parallel segments flow in the further segment. In particular, there are first and second parallel segments, each having a different spacing from the center point and an arcuate length of at least about one circumference and approximately diametrically opposed terminations.

In a second parallel arrangement, there are N parallel segments, each having a different spacing from the center point and an arcuate length of at least about one circumference and terminations arcuately spaced from each other by about $$\frac{360°}{N},$$

where N is an integer greater than 1. In one such parallel embodiment, each of the arcuate portions has approximately a constant separation from the center point. In a second parallel embodiment, each of the arcuate portions has an arcuate extent of about $$\frac{360°}{N},$$

and each arcuate portion of each parallel segment has a different approximately constant separation from the center point.

According to another aspect of the invention, an apparatus for treating a workpiece with a plasma comprises a vacuum chamber in which the plasma is formed and the workpiece is adapted to be located. The vacuum chamber is at a pressure of at least 60 milliTorr while the workpiece is being treated and has a sealed window transparent to electromagnetic energy. A substantially flat coil positioned outside the chamber responds to an r.f. source so an r.f. magnetic field derived from the coil excited by the r.f. source is coupled through the window to excite the plasma. The coil is surrounded by a metal shield so some energy from the coil is coupled to the shield instead of being coupled through the window so there is a tendency for a substantial decrease in energy from the coil as coupled to a region of the chamber approximately aligned with the periphery of the chamber relative to the energy coupled from the coil to a region of the chamber approximately aligned with the center of the window. The coil has a geometry and position relative to the plasma and workpiece to cause the plasma to be excited so the plasma flux is approximately uniform across a surface of the workpiece exposed to the plasma.

In one embodiment, the coil includes at least one peripheral turn in proximity to the shield and at least one further turn inside the peripheral turn. The coil has a geometry such that magnetic flux derived from a center region of the area circumscribed by the coil is substantially less than magnetic flux derived from the coil in a region outside of the center region. Preferably in this embodiment, the coil includes plural turns, all in proximity to the shield and removed from the center of the window.

The coil is connected to the source by first and second terminals at diametrically opposite sides thereof and includes only two turns (i.e. first and second turns) in proximity to the shield and removed from the center of the window. In one embodiment, the turns have circular patterns concentric with the center of the window. Each of the first and second turns has first and second closely spaced ends. The first ends of the first and second turns are respectively at the first and second terminals, while the second ends of the first and second turns are electrically connected together.

One of the concentric turns is a peripheral turn and another of the turns is interior to all other turns. Each of the turns has first and second closely spaced ends such that the first end of the peripheral turn is at the first terminal and the first end of the turn interior to all other turns is at the second terminal. The turns have the remaining ends thereof connected together so the turns are connected in series with each other as a result of the second end of the peripheral turn being connected to a terminal of an interior turn next to the peripheral turn and the second end of the turn interior to all the other turns being connected to an end of the turn next to the turn interior to all other turns.

In certain instances the coil is arranged to have a lower electromagnetic field coupling coefficient to the plasma at the region of maximum current than at the region of minimum current. This result can be attained by arranging the coil to have a smaller self inductance at the region of maximum current than at the region of minimum current. Alternatively, the coil is arranged so it is farther from the workpiece at the region of maximum current than at the region of minimum current. Specifically, the coil is arranged so it is at a greater height above a plane of the workpiece at the region of maximum current than at the region of minimum current.

To facilitate manufacture of the coils while providing the desired magnetic flux distribution to attain uniform plasma flux on the substrate, the plural turn coil has a substantially circular pattern concentric with the center of the window. In a general arrangement the coil includes N turns, each having a substantially circular pattern. Each turn includes first and second adjacent ends. The first end of turn (k−1) is connected to the second end of turn k, while the first end of coil N is connected to a first terminal of an r.f. source and the second end of coil 1 is connected to a second terminal of the r.f. source, where k=1, 2 ... N. In a two turn coil, the coil includes (1) an outer turn having a substantially circular pattern concentric with the center of the window with adjacent first and second ends, and (2) an inner turn having a substantially circular pattern concentric with the center of the window, with adjacent third and fourth ends substantially aligned with the first and second ends. The second and third ends are connected together.

All of these coils have sufficient length at the frequency of the r.f. source to have transmission line type effects that result in the production of an r.f. standing wave pattern so at least one current maximum and minimum exist in the coil at different regions along the coil length. The coils are positioned and arranged so the magnetic fluxes from at least some pairs of adjacent turns are additive. These different regions are adjacent each other so the magnetic fluxes therein have a tendency to add and average to a value causing the plasma flux to be uniform. In certain embodiments, opposite electrical ends of the coil connected to the r.f. source are spatially adjacent each other.

There is a certain amount of capacitive coupling from the planar coil to the plasma. This capacitive coupling is sufficiently low that there is no appreciable degradation in the uniformity of plasma flux on the workpiece processed surface. A small amount of capacitive coupling in a predominantly inductively coupled plasma source has been found to be beneficial to the operation of the discharge. Capacitive coupling of the r.f. voltage on the coil to the plasma through the dielectric plate is required to (1) initiate the plasma discharge and (2) stabilize a steady state plasma discharge. This is because the capacitive coupling introduces a small amount of higher energy electrons in the predominantly low energy inductive discharge. To provide this degree of capacitive coupling without degrading the overall coupling of the coil to the plasma, the coil r.f. voltage spatial distribution is optimized.

Capacitive coupling optimization is primarily accomplished by exciting the coil so it has capacitive coupling peaks (i.e. the points with the highest r.f. voltages) at terminals of the coil in the coil center. These terminals are connected to the r.f. excitation source.

The above and still further objects, features and advantages of the present invention will become apparent upon consideration of the following detailed description of several specific embodiments thereof, especially when taken in conjunction with the accompanying drawings.

DESCRIPTION OF THE PREFERRED EMBODIMENTS

Figure 1:
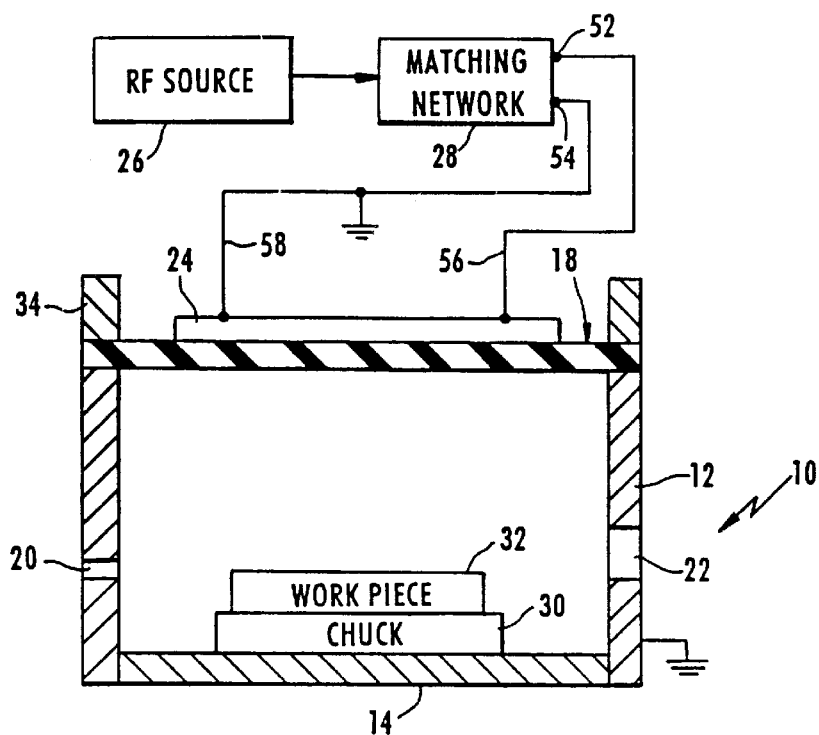
FIG. 1 is a schematic diagram of an r.f. vacuum plasma processor of the type employed with the present invention.

Reference is now made to FIG. 1 of the drawing, wherein a plasma workpiece processor that can be used for etching a semiconductor, dielectric or metal substrate or for depositing molecules on the substrate is illustrated as including vacuum chamber 10, shaped as a cylinder having grounded metal wall 12, metal end face 14, and circular top end plate structure 18, including dielectric window structure 19. Sealing of these conventional surfaces of vacuum chamber 10 is provided by conventional gaskets (not shown).

A suitable gas that can be excited to a plasma is supplied to the interior of chamber 10 from a gas source (not shown) via port 20 in side wall 12. The interior of chamber 10 is maintained in a vacuum condition, at a pressure that can vary in the range of 1–60 milliTorr by a vacuum pump (not shown), connected to port 22 in side wall 12. The gas in vacuum chamber 10 is excited to a planar plasma by a suitable electric source. The electric source includes substantially planar coil 24, usually mounted immediately above window 19 and excited by r.f. source 26 via matching network 28 that is resonant to the frequency of source 26 and includes output terminals 52 and 54, one of which is grounded. Typically, source 26 has a frequency of 13.56 MHz, sufficiently high that coil 24 exhibits transmission line properties. Chuck 30, which can be of the mechanical or electrostatic type, is fixedly mounted in chamber 10 on bottom end plate 16 to selectively hold workpiece 32 in place.

Surrounding planar coil 24 and extending above top end plate structure 18, in alignment with side walls 12, is metal tube or can-like shield 34, providing electromagnetic shielding of the fields originating in coil 24 from the surrounding environment. Shield 34 absorbs a significant amount of the r.f. energy derived from coil 24, particularly from the coil peripheral regions. The amount of magnetic flux coupled from the peripheral portions of coil 24 to the gas in chamber 10 in proximity to shield 34 and in proximity to side walls 12 thus has a tendency to be lower than the magnetic flux coupled to the remainder of the gas in chamber 10. Thereby, the gas in the interior portion of chamber 10 tends to be excited to a plasma having a considerably higher flux than the flux of the plasma in peripheral portions of the chamber. The plasma flux at the periphery of chamber 10 and proximate the periphery of workpiece 32 tends to be substantially less than the plasma flux toward the center of the chamber and substrate. Hence, etching of the substrate and deposition of material on the substrate has a tendency to be greater in the center portion of the substrate than the peripheral portion thereof. This is particularly the case for high pressure vacuum operation of chamber 10, i.e., pressures between 15 and 60 milliTorr.

In accordance with the present invention, the planar plasma resulting from r.f. excitation of planar coil 24 is relatively uniform completely across the processed, exposed surface of substrate 32, which has edge dimensions somewhat less than the interior dimensions of plasma processor chamber 10. Coil 24 is configured so the density of the plasma incident on the substrate is within ±2.5% of the average plasma flux across the substrate processed surface. This uniformity is achieved by decreasing, relative to the prior art, the magnetic flux in the center portion of coil 24 so the center portion magnetic flux is less than the magnetic flux derived from the peripheral and intermediate portions of the coil. By minimizing the magnetic flux in the center of the coil, the plasma flux across the entire substrate remains substantially uniform. Planar coil 24 is designed so the magnetic flux derived from portions of the coil where plasma hot spots tend to be developed are minimized.

The frequency of r.f. source 26 and the length of planar coil 24 between end terminals thereof connected to output terminals 52 and 54 are such that transmission line type effects produce an r.f. standing wave pattern in the coil. Coil 24 is sufficiently long relative to the wavelength of source 26 so at least one peak-to-peak r.f. current maximum occurs in the coil. Because of this factor, there are substantial variations in the amount of magnetic flux supplied by different portions of coil 24 to different regions in chamber 10, resulting in a tendency for the plasma flux in different portions of the chamber and on the substrate to vary considerably. The coil configurations and techniques specifically described herein obviate, to a large extent, and take advantage of these transmission line effects.

Figure 2:
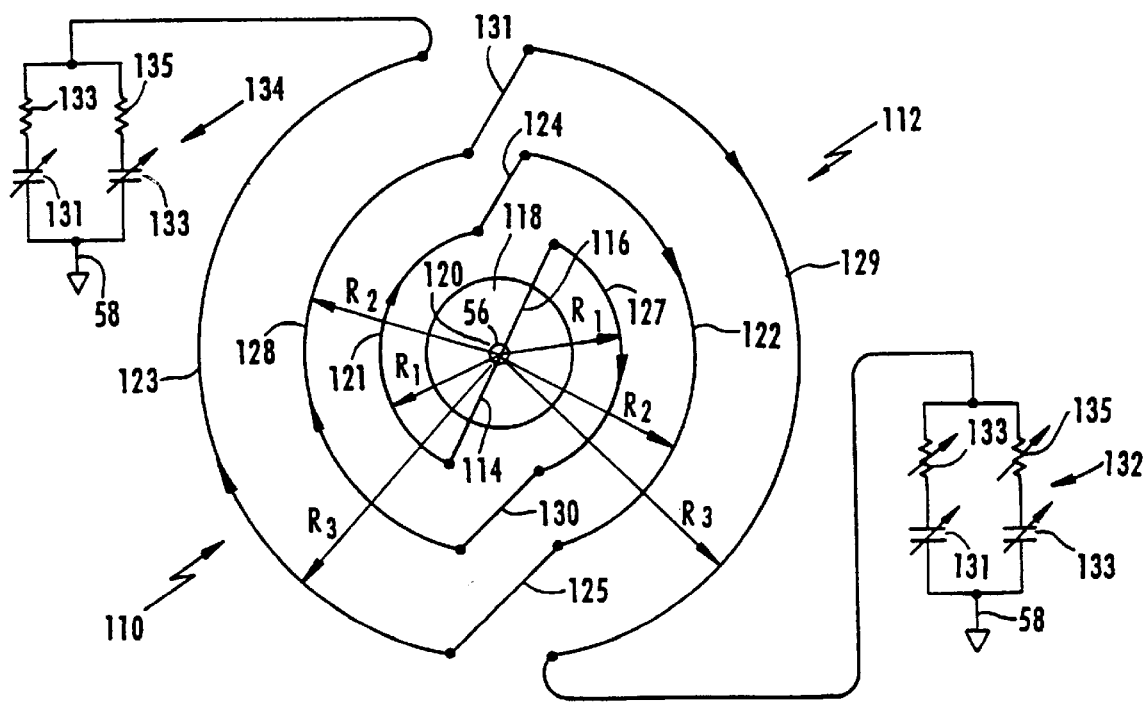
FIG. 2 is a top view of a planar coil for use in the processor of FIG. 1, wherein the coil includes two electrically parallel segments having a common center connection and diametrically opposed peripheral connections to an r.f. source.

Reference is now made to FIG. 2 of the drawing, a top view of a version of planar coil 24 including two electrically parallel segments 110 and 112, respectively connected by leads 114 and 116 via lead 56 to terminal 52. The connections of leads 114 and 116 are such that the currents in these leads have very little effect on the plasma in chamber 10. Such a result can be achieved by arranging leads 56, 114 and 116 so they extend at right angles to window 19 and the plane of the coil, or by arranging leads 114 and 116 so they lie parallel to the plane of the coil, but are electrically and magnetically isolated from the coil by interposing metal disc 118 between the coil and leads. Opposite planar faces of disc 118, which respectively contact the coil and leads, are covered by a dielectric coating (not shown). Lead 56 is connected to a terminal at the center of dielectric coated metal disc 118.

Each of coil segments 110 and 112 includes three substantially semicircular series connected coil portions, each having an arcuate extent of about 175°, and a different radius. The three semicircular portions are connected to each other by two straight leads extending in the radial and somewhat circumferential directions. Thus, coil segment 110 includes coil portions 121, 122 and 123, respectively having radii of $R_1$, $R_2$ and $R_3$ relative to axis 120, and connected together by straight radially and circumferentially extending leads 124 and 125. Coil portions 121 and 123 are on the same first side of substrate center axis 120, while coil portion 122 is on the diametrically opposite second side of the axis. In a similar but opposite manner, coil segment 112 includes semicircular coil portions 127, 128 and 129, respectively having radii of $R_1$, $R_2$ and $R_3$ relative to axis 120 and connected together by straight radially and circumferentially extending leads 130 and 131. Coil portion 128 is diametrically opposed to coil portions 127 and 129, which are on the same side of axis 120 as coil portion 122. The common radius, $R_1$, of coil portions 121 and 127 is slightly greater than the radius of disc 118, so that magnetic flux from semicircular coil portions 121 and 127 is effectively coupled into chamber 10. The values of radii $R_1$, $R_2$ and $R_3$ are comparable to the radius of the substrate being processed by the plasma in chamber 10; for example, if a circular substrate having a 10 cm radius is being processed, the values of $R_1$, $R_2$ and $R_3$ are on the order of 7.5 cm, 10 cm and 12.5 cm.

End points of each of generally semicircular portions 121–123 and 127–129 on a particular side of center axis 120 are substantially aligned and connected to the straight radially and circumferentially extending leads 124, 125, 129 and 130. The spatial arrangement of coil portions 121–130 is such that current flows in the same first direction in those coil portions on one side of axis 120 and in the opposite second direction in the coil portions on the other side of the axis. The ends of exterior or peripheral coil portions 123 and 128 are respectively connected to a terminal connected to lead 58 via appropriate variable impedances 132 and 134. In the illustrated embodiment impedances 132 and 134 are configured as capacitors 131 and 133 respectively connected in series with resistors 133 and 135, although an inductive impedance can be employed. The values of impedances 132 and 134 set the position of the r.f. standing waves which occur in the two portions of the coil, 121–123 and 127–129. The magnitude of the r.f. current occurring at the endpoints of the coil are often set to the same value by properly adjusting the types and values of impedances 132 and 134.

Because of the transmission line properties of parallel coil segments 110 and 112, there are current and voltage maxima and minima in these segments. The current maxima are diametrically opposite from each other in outer coil portions 123 and 128, approximately 30 spatial degrees from the end points of coil segments 110 and 112. Because (1) the current maxima occur in the coil portions in closest proximity to metal can 34, and (2) of the additive effects of the magnetic fluxes from the coil portions, resulting from the current flowing in the coil portions on a particular side of axis 120 flowing in the same direction, and (3) the value of $R_1$ is such that there is minimum magnetic flux in the center of the area circumscribed by the coil, and the magnetic flux coupled to the gas in chamber 10 immediately below the window is lower in the center of the chamber than in the periphery of the chamber. The magnetic flux between the intermediate and peripheral portions of the chamber just below window 19 is relatively uniform. The plasma flux just below window 19 thereby has a tendency to be less than the plasma flux in the peripheral portions of the chamber just below the window. The plasma flux diffuses toward the center of the chamber in regions removed from window 19 and is relatively uniform across the exposed processed surface of substrate 32.

Figure 3:
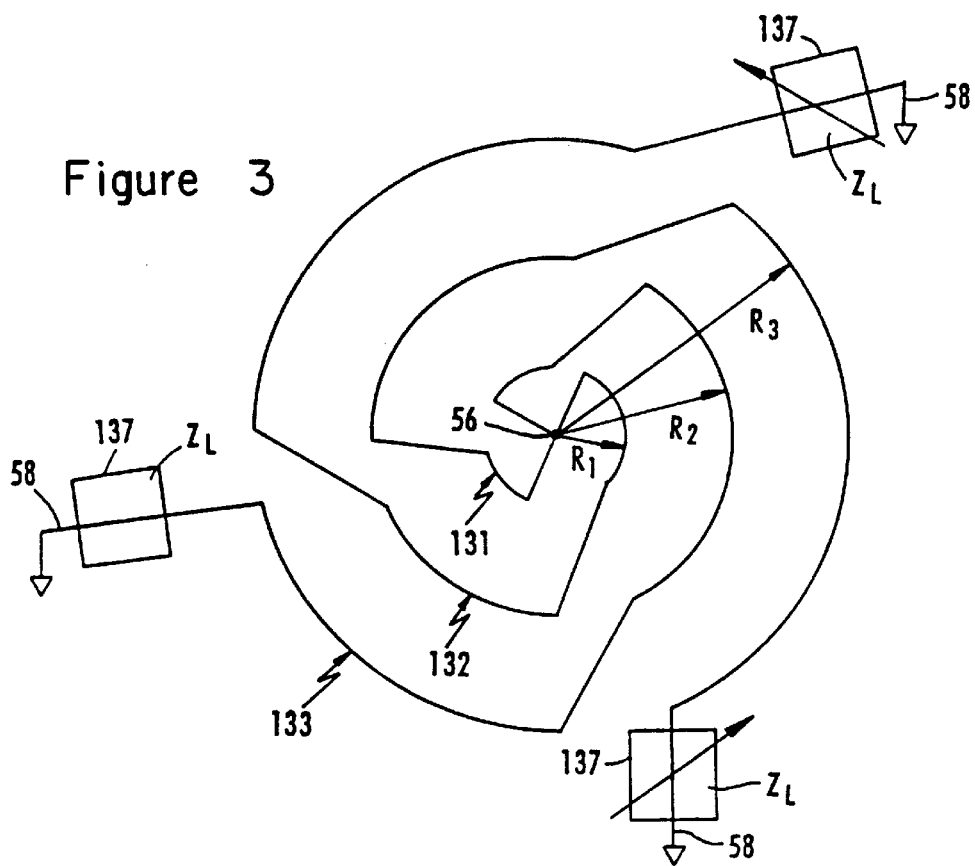
FIG. 3 is a top view of a planar coil having three electrically parallel segments, each having a center connection and three peripheral r.f. excitation source connections, each spaced approximately 120° apart.

Another parallel coil arrangement, similar to that of FIG. 2, is illustrated in FIG. 3 as including three parallel coil segments 131, 132 and 133, each having one end connected to a terminal connected to lead 56 and a second end connected via variable impedances 137 to terminal 54 via lead 58. Each of impedances 137 is similar to and is adjusted to perform the same functions as impedances 132 and 134, FIG. 2. Each of coil segments 131–133 includes first, second and third arcuately aligned portions, each having an arcuate extent of slightly less than 120°, i.e., about 117°, and two straight radially and circumferentially extending portions. The first, second and third arcuately extending portions respectively have radii of $R_1$, $R_2$ and $R_3$. The geometry of coil segments 131–133 is such that the r.f. currents flow through the aligned arcuate portions in the same direction, to provide an additive magnetic flux relationship and uniformity of plasma flux on the processed substrate. The current maxima in coil segments 131–133 occur in the portions of the coil segments having a radius of $R_3$, approximately 30 spatial degrees from the end points of the coil segments. The magnetic fluxes in the coil segments having a radius $R_3$ is thus greatest, to overcome the tendency for metal can 34 to reduce the magnetic flux coupled into chamber 10.

Figure 4:
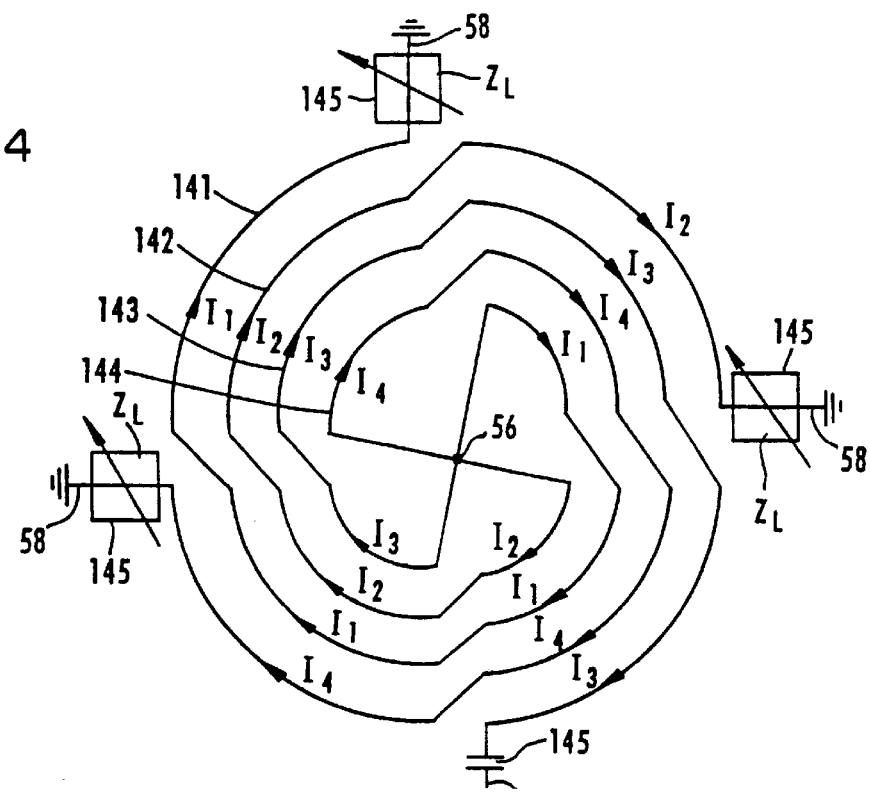
FIG. 4 is a top view of a planar coil having four electrically parallel segments, each having a center connection and four peripheral r.f. excitation source connections spaced 90° from each other.

A preferred parallel configuration, illustrated in FIG. 4, includes four coil segments 141–144, each having a connection to a terminal connected to lead 56 and a connection to a terminal connected to lead 58 via variable impedances 145, each of which is similar to and is adjusted to perform the same function as impedances 132 and 134, FIG. 2. Each of coil segments 141–144 includes four coil portions. Each of the coil portions has an arcuate extent of approximately 90° and a different radius, $R_4$, $R_5$, $R_6$ and $R_7$, respectively, of progressively larger value. The coil portions having radii $R_4$, $R_5$, $R_6$ and $R_7$ are connected together by straight generally radially and circumferentially extending coil portions, which are, for a particular coil segment, displaced 90° of arc from each other. Coil segments 141–144 are such that the straight radially and axially extending segments interconnecting the arcuately extending portions of a particular coil segment are aligned so the longitudinal axes thereof extend parallel to each other.

The geometry of coil segments 141–144 and the connections thereof to the terminals connected to leads 56 and 58 are such that the current flowing in those coil segments in the same quadrant relative to axis 120 is in the same direction. Radius $R_4$ is selected so the magnetic fluxes resulting from currents flowing in the arcuate portions of segments 141–144 have a tendency to cancel each other. This causes a relatively low magnetic flux to be derived in the center of the area circumscribed by the coil. The values of radii $R_5$, $R_6$ and $R_7$, however, are such that the magnetic fluxes resulting from currents flowing in adjacent portions of the same quadrant of coil segments 142–144 are additive to overcome the effect of can 34 on the magnetic field in the periphery of chamber 10. To these ends, the values of $R_4$, $R_5$, $R_6$ and $R_7$ are preferably respectively 30 cm, 25 cm, 15 cm and 4 cm for a 20 cm radius substrate. Current maxima occur in the outer, i.e., peripheral, portions of coil segments 141–144 having radii $R_7$, approximately 30 spatial degrees from the end of each coil segment.

Figure 5:
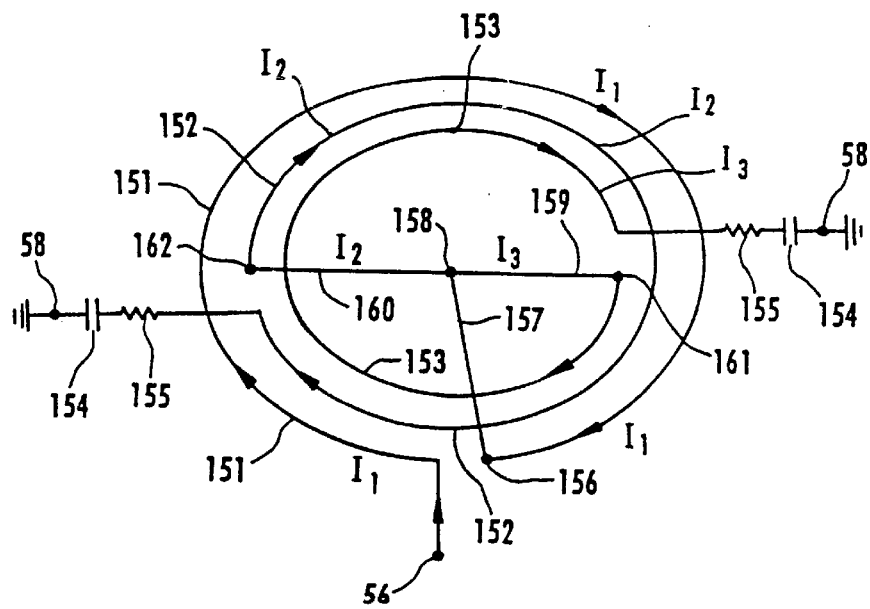
FIG. 5 is a top view of a planar coil having a peripheral segment electrically in series with two parallel interior segments.

A ton view of a further modification is illustrated in FIG. 5 as including outer coil segment 151, connected to a terminal connected to lead 56 and electrically in series with two parallel coil segments 152 and 153, connected by variable impedances 154 to a grounded terminal connected to lead 58. Each of impedances 154 is constructed similarly to and is adjusted to perform the same functions as impedances 132 and 134, described supra in connection with FIG. 2. Each of coil segments 151–153 has an arcuate extent of slightly less than 360° and a different radius $R_8$, $R_9$ and $R_{10}$, of progressively smaller values; in one preferred embodiment $R_8$, $R_9$ and $R_{10}$ are respectively 10.5, 10.0 and 9.5 inches for a 10 inch radius substrate. End point 156 of coil segment 151, remote from terminal 56, is connected to central, axial terminal 158, in turn connected by radially extending leads 159 and 160 to end points 161 and 162 of coil portions 152 and 153. Magnetic flux resulting from current flowing in leads 157 and 158 is shielded from the gas in chamber 10 by an insulated metal disc as described supra for FIG. 2.

The instantaneous currents in adjacent portions of coil segments 151–153 flow in the same directions, causing the magnetic fluxes resulting from these currents to be additive. The current in coil segment 151 has a value equal to twice the separate currents flowing in each of coil portions 152 and 153 to assist in overcoming the flux attenuating properties of can 34. The magnetic flux derived by the coil of FIG. 5 has a minimum value in the center of the coil. The plasma flux in the chamber is relatively constant because of the combined additive effects of the magnetic fluxes resulting from currents flowing in coil segments 151–153 that are considerably closer to can 34 than to lead 158 at the center of the coil.

Figure 6:
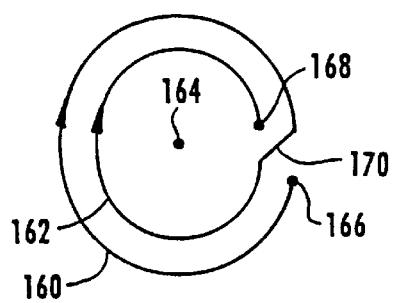
FIG. 6 is a top view of a planar coil including two circular peripheral portions.

Reference is now made to FIG. 6 of the drawing, a top view of still another embodiment of the invention wherein planar coil 24 includes two circular segments, 160 and 162, respectively having arcuate extents of slightly less than 360° and relatively large radii $R_{11}$ and $R_{12}$ from common central axis 164, that extends through the center of chamber 10 and the processed substrate. Coil segments 160 and 162 respectively include end terminals 166 and 168, connected to leads 56 and 58. The opposite ends of coil segments 160 and 162 are connected to each other by straight, radially and circumferentially extending lead 170. Radii $R_{11}$ and $R_{12}$ are respectively slightly more and slightly less than the radius of the processed substrate.

Coil segments 160 and 162 are arranged so the currents flowing in adjacent sector portions of these two coil segments flow in the same direction to provide additive magnetic fluxes that interact with the gas in chamber 10. The coil formed by segments 160 and 162 is considered to be a circular coil. The value of radius $R_{12}$ is sufficiently large that the currents flowing in opposite directions on opposite sides of axis 164 produce magnetic fluxes that are sufficiently far apart from each other to avoid substantial cancellation effects while still providing a lower magnetic flux in the center of the coil than any other part of the area circumscribed by exterior coil segment 162. Typically, the minimum value of $R_{11}$ to achieve these results is 5 cm. The combined magnetic fluxes produced by coil segments 160 and 162 are sufficiently great to overcome the tendency of can 34 to attenuate the peripheral portions of the magnetic field. Because of the hollow nature of the coil formed by segments 160 and 162, the magnetic fluxes resulting from current flowing in them are such that the plasma flux is relatively uniform across the entire diameter of the processed substrate.

Figure 7:
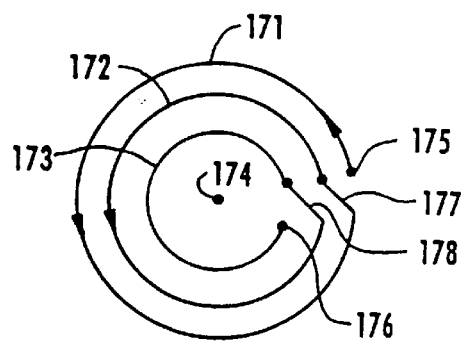
FIG. 7 is a top view of a planar coil having three circular peripheral portions.

FIG. 7 is a top view of a further hollow coil embodiment employing three circular segments 171, 172 and 173, respectively spaced from central axis 174, which is coincident with the center of chamber 10 and the processed substrate 32, by radial distances $R_{13}$, $R_{14}$ and $R_{15}$. The values of $R_{13}$, $R_{14}$ and $R_{15}$ are progressively smaller, with the minimum radius, $R_{15}$, being 5 cm. Typically, the processed substrate 32 has a radius of approximately $R_{14}$ (i.e. between $R_{13}$ and $R_{15}$), such that coil segment 172 is generally aligned with the periphery of the processed substrate, while coil segments 171 and 173 are respectively slightly outside and slightly inside the periphery of the processed substrate.

Coil segments 171 and 173 include end terminals 175 and 176, respectively connected to leads 56 and 58. The ends of coil segments 171 and 173 opposite from end terminals 175 and 176 are respectively connected to ends of coil segment 173 by radially and circumferentially extending straight leads 177 and 178.

Current flows in adjacent sector portions of coil segments 171, 172 and 173 in the same direction, so the magnetic fluxes derived by these coil segments are additive to overcome the effects of can 34 and provide a relatively uniform plasma flux on the processed substrate. The resulting magnetic field has a minimum value on axis 174 and in the vicinity of the axis and a peak value in the vicinity of coil segment 172. The magnetic flux variation between the center of the hollow coil and underneath coil portion 172, where the flux has a peak value, is such that the plasma flux on the processed substrate is constant to approximately ±2.5 percent.

The radially and circumferentially extending leads in all of the embodiments of FIGS. 2–7 extend in these two directions, rather than only radially, because such a radial lead would require a right angle bend in conductors carrying relatively large r.f. currents (e.g. tens of amperes). Right angle bends in the coils of FIGS. 2–7 are disadvantageous because of the nature of r.f. magnetic field that would result from such a bend. A right angle bend causes a very abrupt change in the r.f. current path. The abrupt current path change has a tendency to produce a large magnetic field, which could have an adverse effect on the uniformity of the magnetic fields and plasma flux in chamber 10.

Figure 8:
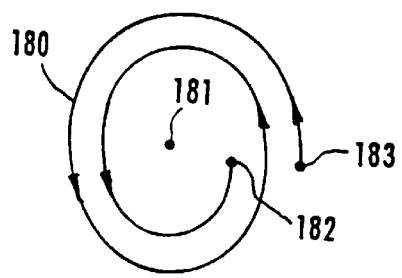
FIG. 8 is a top view of a planar spiral coil having no turns in the center thereof.

Reference is now made to FIG. 8, a top view of a hollow coil 180 configured as an equilateral spiral having three turns, with a minimum radius and interior end terminal 182 substantially displaced from central axis 181; axis 181 coincides with the common axes of chamber 10 and the processed substrate. The three turns of coil 180 have average radii of $R_{13}$, $R_{14}$ and $R_{15}$ relative to central axis 181, such that $R_{14}$ equals approximately the radius of the substrate and $R_{13}$ and $R_{15}$ are respectively somewhat smaller and larger than $R_{14}$. End terminals 182 and 183 of spiral coil 180 are respectively connected to leads 56 and 58. End terminal 182 is radially displaced from center axis 181 by an amount slightly less than $R_{13}$, while end terminal 183 is radially displaced from axis 181 by an amount slightly in excess of $R_{15}$. End terminals 182 and 183 lie along approximately the same radial line extending from axis 181. The currents flowing in the three turns of coil 180 produce additive magnetic fluxes in the plasma in chamber 12 such that the magnetic flux is approximately constant in the area of chamber 12 between radii $R_{13}$ and $R_{15}$.

Because of the relatively large separation between end terminal 182 and axis 181 and the relationships of the currents in turns 171–173 there is minimum magnetic flux in the center of the coil of FIG. 8 and the magnetic flux increases to a maximum in a region outside chamber 12 adjacent outer turn 171. Because of the magnetic flux shielding properties of can 34, a substantial portion of the magnetic flux outside chamber 12 and adjacent turn 171 is not coupled to the plasma in chamber 10. The effect is to cause a uniform magnetic field to be coupled to exterior portions of the plasma and a lower magnetic field to be coupled to center portions of the plasma. The plasma flux incident on the workpiece processed surface is substantially uniform because the higher plasma flux in chamber 12 abutting window 18 and somewhat close to the chamber wall diffuses to the center of the chamber. The diffusion occurs because of the differences in plasma flux (plasma density multiplied by plasma particle speed) at the two regions and because of the relative values of (1) the spacing between the workpiece treated surface and the bottom face of window 19 and (2) the diameter of the inner wall of chamber 10.

The spiral coil arrangement of FIG. 8 and the circular coil arrangements of FIGS. 6 and 7 can be modified to provide any desired number of turns. In addition, the size of the open area in the center of the coil can be adjusted, as appropriate, to provide the necessary uniformity of the plasma flux incident on the substrate.

The efficiency with which plasma is generated in chamber 10 in response to inductive coupling from the planar sources of FIGS. 2–8 depends on the amount of electromagnetic coupling between the plasma r.f. current flowing in the coil and the amplitudes of the r.f. magnetic flux coupled to the plasma. The coupling primarily depends on two factors: (1) the dielectric constant of the materials separating the coil from the plasma, and (2) the separation distance between the coil and plasma.

Because of the transmission line effects of the coils of each of the embodiments of FIGS. 2–8, the magnitudes of the r.f. peak-to-peak currents in different portions of the coils vary. One feature of the invention is that a spatially uniform plasma flux is provided in chamber 10 despite the variations of the r.f. currents in the planar coils of FIGS. 2–8. The uniform plasma flux is achieved by decreasing electromagnetic coupling between portions of the coils having maximum r.f. peak to peak currents. The differential electromagnetic coupling from the coil portions having maximum and minimum current levels is achieved, in accordance with one aspect of the invention, by tilting the planar coils relative to dielectric window 19.

A planar coil, of the type illustrated in each of FIGS. 2–8, that is oriented parallel to dielectric window 19, causes the plasma in chamber 10 to have two nonuniform components, namely: (1) a radial component, f(R), where R is radial distance from the common center of the coil, dielectric window, vacuum chamber and substrate, and (2) an angular component f(θ), where θ is an angle measured relative to a specific radial orientation. In most cases, a pair of mutually orthogonal axes, A and B, can be selected such that the angular dependent plasma non-uniformity, f(θ), has a pseudo-linear dependence on axis A, and is approximately independent of axis B. To minimize the angular dependent plasma non-uniformity, the coil is positioned along axis B, so the distance between the plane of the coil and dielectric window 19 is greatest for the region corresponding to the maximum plasma flux. A tilt angle of approximately 9–18° between the planes of the coil and window 19 is believed to produce the most uniform plasma flux.

Figure 9:
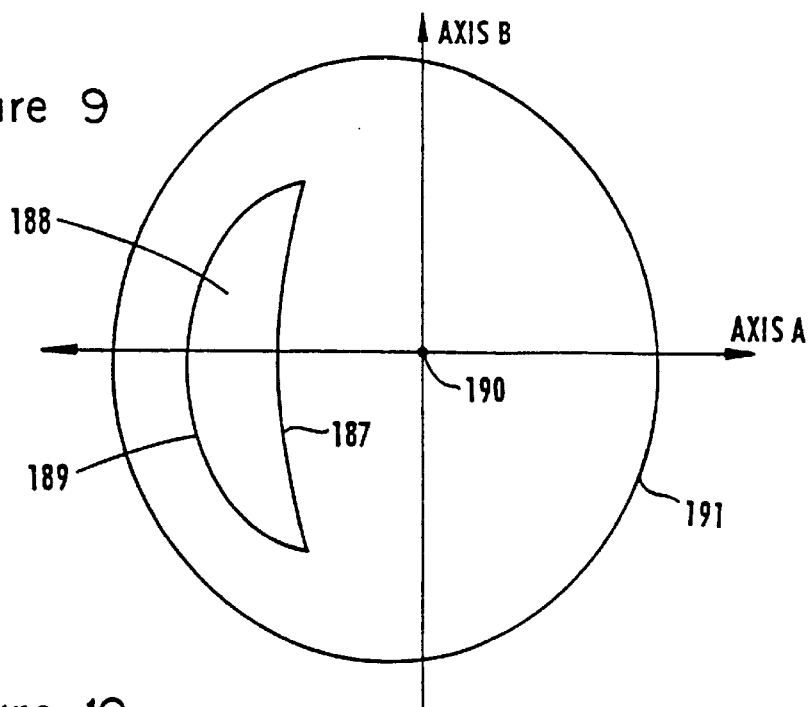
FIG. 9 is a plot of plasma flux resulting from plasma excitation by any of the coils illustrated in FIGS. 2–8 when the coils are positioned in a plane parallel to a window of the vacuum plasma processor of FIG. 1.

If the planar coils of FIGS. 2–8 were located so the plane of the coil were parallel to the plane of window 19, there would be a tendency for the plasma flux in chamber 10 to be a maximum in crescent shaped region 188, FIG. 9. Region 188 includes arcuate edge 189, similar in curvature to a sector of the circumference of a circle, and arcuate edge 187 having a curvature that is much less than that of side 189. Both of edges 187 and 189 are approximately bisected by axis A so region 188 has its greatest width along axis A, which intersects axis B approximately along chamber axis 190.

To overcome this tendency, the planar coil of any of FIGS. 2–8 can be tilted upwardly relative to window 19, so a peripheral edge of the coil touches the window at the intersection of axis A and the circumference of circle 191 having a center on axis 190 and a radius such that the circumference of the circle has a curvature appreciably greater than that of edge 189. The diametrically opposite edge of the planar coil is approximately aligned with and is above the intersection of axis A and the circumference of circle 191 opposite from the point on the circle contacting the coil. Since axis A and the planar coil on the side of axis B opposite from area 188 are remote from crescent shaped region 188, the tendency for region 188 to be formed is generally overcome and an approximately uniform plasma flux results on the processed workpiece surface.

Figure 10:
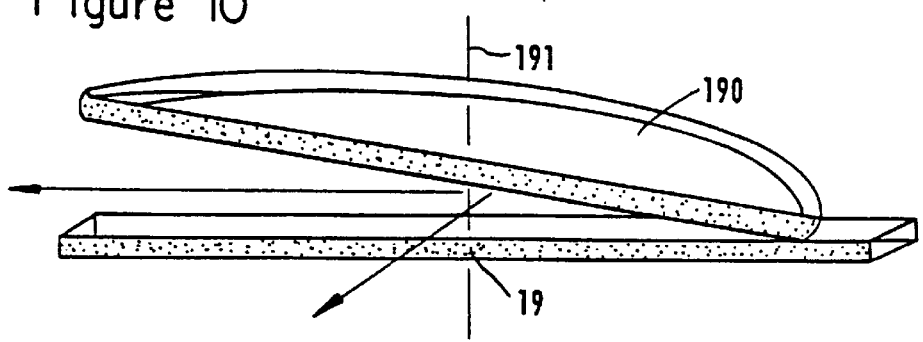
FIG. 10 is a perspective view of a planar coil tilted with respect to a dielectric window of the plasma processor of FIG. 1.

A structure for achieving this result is schematically illustrated in perspective in FIG. 10 wherein the plane of planar coil 190, which can have any of the configurations illustrated in FIGS. 2–8, is tilted above window 19 by 9° to 18°. Coil 190 is positioned so the places where the current therein has maximum peak-to-peak values are directly above region 188 to reduce the effects of the maximum currents and provide uniformity of plasma flux on the processed substrate.

Another way to provide a magnetic field that produces a plasma having a relatively uniform density while overcoming the effects of can 34 and the variations in magnetic field resulting from the peak-to-peak current variations is to vary the self inductance of the coils of FIGS. 2–8 as a function of position along the length of the coil. As is well known, the self inductance of a wire is inversely proportional to the cross sectional area of the wire. An aspect of the present invention relies on this principle to maximize the magnetic field in the periphery of chamber 10, minimize the magnetic field in the center of the chamber and reduce the magnetic field in region 188.

Figure 11:
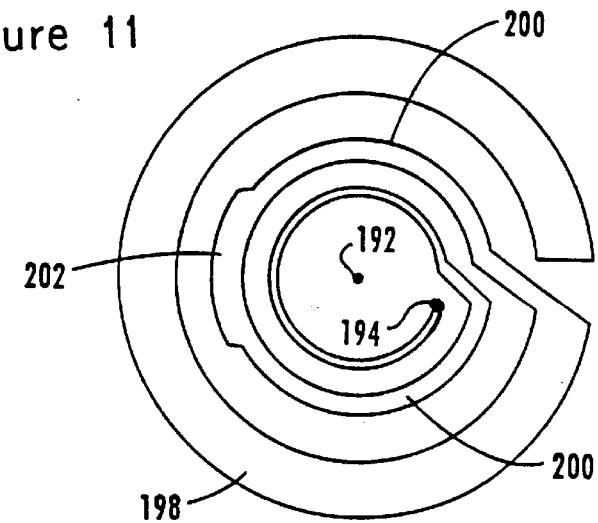
FIG. 11 is a top view of a coil having differing self-inductance values along its length by virtue of the coil having differing cross sectional areas.

In the embodiment of FIG. 11, this result is attained by arranging spiral coil 192, having the same general configuration as the coil of FIG. 7, so coil 192 has (1) a minimum cross sectional area at and close to interior terminal 194, close to central axis 192, (2) maximum cross sectional area in peripheral portion 198, (3) an average cross sectional area in intermediate portion 200 removed from the coil portion 202 vertically aligned with region 188, and (4) a less than average cross sectional area (greater than the minimum cross sectional area) in coil portion 202 above region 188. This principle can be used as appropriate, in any of the embodiments of FIGS. 1–8. Preferably, the variations in cross sectional area are attained by increasing and decreasing the thickness of a wire lead forming the coil and having a rectangular cross section with a constant width. Other equivalent alternative arrangements can be used, e.g. varying the width of a constant thickness rectangular cross section lead, varying the thickness and width of a rectangular cross section lead or a square cross section lead, or varying the diameter of a circular cross section lead.

A similar effect can be obtained by positioning the coils of FIGS. 2–8 in many different planes above window 19 so (1) the coil peripheral portion is closest to the plane of the window, (2) the coil interior terminal and the coil portion closest to it are farther from the plane of the window than any other coil portion, (3) the intermediate coil portion not vertically aligned with region 188 has an average separation from the plane of the window, and (4) the coil portion vertically aligned with region 188 has a separation from the plane of the window between the coil portion farthest from the plane of the window and the average separation between the coil and the window. An obvious disadvantage of this approach, however, concerns difficulties inherent in making and maintaining such coil.

While there have been described and illustrated several specific embodiments of the invention, it will be clear that variations in the details of the embodiments specifically illustrated and described may be made without departing from the true spirit and scope of the invention as defined in the appended claims.

What is claimed:

1. A vacuum plasma processor for treating a workpiece in a vacuum chamber comprising a coil having plural turns for exciting gas in the processor to a plasma state in response to r.f. energization of the coil, the turns of the coil being arranged so the coil extends radially and circumferentially between an interior turn and an exterior turn, the coil being surrounded by a shield which tends to cause magnetic flux coupled from peripheral portions of the coil to the gas to be less than magnetic flux coupled from interior portions of the coil to the gas, the coil being arranged so magnetic flux derived from an exterior portion of an area circumscribed by the coil is greater than the magnetic flux derived from interior portions of the area circumscribed by the coil so plasma flux across the workpiece is substantially the same.

2. The vacuum plasma processor of claim 1 wherein the coil includes plural parallel windings driven in parallel by r.f. current from a source of the r.f. energization, each winding including plural portions on diametrically opposite sides of a center point of the area, each of the plural portions being removed from the area center point, the winding segments being arranged and connected to the r.f. source so instantaneous r.f. current flows in the same direction in spatially adjacent portions of the different parallel segments.

3. The vacuum plasma processor of claim 2 wherein a common terminal for connection of said windings to the source is in the center portion of the area.

4. The vacuum plasma processor of claim 2 wherein the parallel windings are surrounded by a further winding connected in series to the parallel windings so the sum of the currents flowing in the parallel windings flows in the further winding.

5. The vacuum plasma processor of claim 4 wherein there are first and second parallel windings each having a different spacing from the center point and a length of at least about one circumference and approximately diametrically opposed terminations.

6. The vacuum plasma processor of claim 2 wherein there are N parallel windings each having a different spacing from the center point and a length of at least about one circumference and terminations spaced from each other by about $$\frac{360°}{N},$$

where N is an integer greater than 1.

7. The vacuum plasma processor of claim 6 wherein each of the windings has approximately the same separation from the center point throughout its length.

8. The vacuum plasma processor of claim 6 wherein each of the windings includes a turn portion having an extent of about $$\frac{360°}{N},$$

each turn portion of each parallel winding having approximately the same separation from the center point throughout its length, the different turn portions of each parallel winding having a different separation from the common point.

9. The vacuum plasma processor of claim 1 wherein the coil includes (i) first and second terminals at opposite ends thereof coupled to opposite terminals of a source of the r.f. excitation and (ii) plural turns in proximity to the shield and removed from the center of the window.

10. The vacuum plasma processor of claim 9 wherein the plural turns have substantially the same geometric patterns substantially concentric with the center of the window, one of the turns being a peripheral turn, another of the turns being a turn interior to all other turns, each of the turns having first and second closely spaced ends, the first end of the peripheral turn being at the first terminal, the first end of the turn interior to all other turns being at the second terminal, the turns having remaining ends connected together so the turns are connected in series with each other as a result of the second end of the peripheral turn being connected to a terminal of an interior turn next to the peripheral turn and the second end of the turn interior to all other turns being connected to an end of the turn next to the turn interior to all other turns.

11. The vacuum plasma processor of claim 1 wherein the coil has sufficient length for the frequency of the r.f. excitation to have transmission line type effects so that at least one current maximum and minimum exist in the coil at different locations along the coil length, the coils being positioned and arranged so the magnetic fluxes from at least some pairs of adjacent turns are additive, and the different locations are adjacent each other.

12. The vacuum plasma processor of claim 11 wherein the coil is arranged to have a lower electromagnetic field coupling coefficient to the plasma at a region of maximum peak-to-peak current than at a region of minimum peak-to-peak current.

13. The vacuum plasma processor of claim 12 wherein the coil is arranged to have a lower self inductance at the region of maximum peak-to-peak current than at the region of minimum peak-to-peak current.

14. The vacuum plasma processor of claim 12 wherein one portion of the coil is arranged so it is farther from the workpiece than other portions of the coil.

15. The vacuum plasma processor of claim 14 wherein the coil is positioned in a plane tilted at an angle with respect to a place of the workpiece.

16. The vacuum plasma processor of claim 1 wherein the coil has a spiral-like shape and an interior terminal connected to one side of a source of the r.f. excitation and substantially spaced from a center point of the area circumscribed by the coil and an exterior terminal connected to a second side of the source.

17. The vacuum plasma processor of claim 1 wherein the chamber includes a sealed window transparent to electromagnetic energy, the coil being located outside the processor and positioned to couple energy to plasma in the chamber through the window.

18. A vacuum plasma processor for treating a workpiece in a vacuum chamber comprising a coil having plural turns for exciting gas in the processor to a plasma state in response to r.f. energization of the coil, the turns of the coil being arranged so the coil extends radially and circumferentially outward from an interior turn to an exterior turn, the coil including plural electrically parallel windings driven in parallel by r.f. current from a source of the r.f. energization, each winding including plural portions on diametrically opposite sides of a center point of the area, each of the portions being removed from the area center point, the windings being arranged and connected to the r.f. source so instantaneous r.f. current flows in the same direction in spatially adjacent portions of the different parallel windings.

19. The vacuum plasma processor of claim 18 wherein a common terminal for connection of said windings to the source is in a center portion of the area.

20. The vacuum plasma processor of claim 18 wherein the parallel windings are surrounded by a further winding connected in series to the parallel windings so the sum of the currents flowing in the parallel windings flows in the further winding.

21. The vacuum plasma processor of claim 20 wherein there are first and second parallel windings each having a different spacing from the center point and a length of at least about one circumference and approximately diametrically opposed terminations.

22. The vacuum plasma processor of claim 19 wherein there are N parallel windings each having a different spacing from the center point and a length of at least about one circumference and terminations spaced from each other by about $$\frac{360°}{N},$$

where N is an integer greater than 1.

23. The vacuum plasma processor of claim 18 wherein there are N parallel windings each having a different spacing from the center point and a length of at least about one circumference and terminations spaced from each other by about $$\frac{360°}{N},$$

where N is an integer greater than 1.

24. The vacuum plasma processor of claim 22 wherein each of the portions has an extent of about $$\frac{360°}{N},$$

each portion of each parallel segment having approximately the same separation from the center point throughout its length, the different portion of each parallel segment having a different separation from the common point.

25. A vacuum plasma processor for treating a workpiece in a vacuum chamber comprising a coil having plural turns for exciting gas in the processor to a plasma state in response to r.f. energization of the coil, the turns of the coil being arranged so the coil extends radially and circumferentially outward from an interior turn to an exterior turn, the coil including plural electrically parallel windings driven in parallel by r.f. current from a source of the r.f. energization, each winding including plural portions on diametrically opposite sides of a center point of the area, each of the portions being removed from the area center point, the windings being arranged and connected to the r.f. source so the parallel windings are surrounded by a further winding connected in series to the parallel windings so the sum of the currents flowing in the parallel windings flows in the further winding.

* * * * *